(12) United States Patent
Zhang

(10) Patent No.: US 10,120,232 B2
(45) Date of Patent: Nov. 6, 2018

(54) METHODS OF FABRICATING QUANTUM DOT COLOR FILM SUBSTRATES

(71) Applicant: Shenzhen China Star Optoelectronics Technology Co., Ltd., Shenzhen (CN)

(72) Inventor: Xia Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 234 days.

(21) Appl. No.: 15/023,691

(22) PCT Filed: Jan. 29, 2016

(86) PCT No.: PCT/CN2016/072877
§ 371 (c)(1),
(2) Date: Mar. 22, 2016

(87) PCT Pub. No.: WO2017/096710
PCT Pub. Date: Jun. 15, 2017

(65) Prior Publication Data
US 2018/0031912 A1 Feb. 1, 2018

(30) Foreign Application Priority Data

Dec. 8, 2015 (CN) .......................... 2015 1 0897061

(51) Int. Cl.
G02F 1/1335 (2006.01)
C01B 32/194 (2017.01)
(Continued)

(52) U.S. Cl.
CPC .. *G02F 1/133516* (2013.01); *B29D 11/00865* (2013.01); *B41M 3/003* (2013.01);
(Continued)

(58) Field of Classification Search
CPC ......... G02F 1/133516; G02F 1/133512; G02F 1/136209; G02F 2001/133622;
(Continued)

(56) References Cited

U.S. PATENT DOCUMENTS 6,154,265 A * 11/2000 Kamio .................. C09K 19/04
252/299.01
9,671,646 B1 * 6/2017 Tang ................. G02F 1/133621
(Continued)

FOREIGN PATENT DOCUMENTS

CN 101338187 A * 1/2009
CN 102643501 A * 8/2012

*Primary Examiner* — Sophia Nguyen
(74) *Attorney, Agent, or Firm* — Leong C. Lei

(57) ABSTRACT

The present application provides a method of fabricating a quantum dot color film substrate, red and green quantum dots are respectively formulating into red and green quantum dot inks, then formation is performed by an inkjet printing, and a color filter layer is obtained, thereby brightness and color saturation of displays can be increased; simultaneously, the red quantum dot ink and the green quantum dot ink at least have an ink of epoxy resin system therein, when the ink of epoxy resin system is yet cured, a graphene conductive layer is formed thereon to act as an electrode, so that a greatly improved adhesion of the graphene conductive layer and the color filter layer can be obtained. Additionally, to replace ITO by utilizing graphene as a conductive layer can alleviate current issues of few ITO sources and increasing price, and the graphene has conductivity and high transmittance that make display quality of TFT-LCD screen be guaranteed, and an overall thinned and lightened panel be achieved. Such design helps increasing conductivity and integrating benefits, and also has very great application prospect in curved panel market.

12 Claims, 4 Drawing Sheets

(51) Int. Cl.

| | |
|---|---|
| *C01B 32/186* | (2017.01) |
| *C23C 16/26* | (2006.01) |
| *C23C 18/12* | (2006.01) |
| *C23C 18/14* | (2006.01) |
| *G02B 5/20* | (2006.01) |
| *G02B 5/22* | (2006.01) |
| *H01L 31/0352* | (2006.01) |
| *H01L 33/06* | (2010.01) |
| *H01L 51/50* | (2006.01) |
| *B41M 3/00* | (2006.01) |
| *G02F 1/017* | (2006.01) |
| *G02F 1/1362* | (2006.01) |
| *B29D 11/00* | (2006.01) |
| *B82Y 30/00* | (2011.01) |

(52) U.S. Cl.
CPC .......... *C01B 32/186* (2017.08); *C01B 32/194* (2017.08); *C23C 16/26* (2013.01); *C23C 18/1295* (2013.01); *C23C 18/14* (2013.01); *G02B 5/201* (2013.01); *G02B 5/223* (2013.01); *G02F 1/1335* (2013.01); *G02F 1/133512* (2013.01); *G02F 1/133617* (2013.01); *H01L 31/035218* (2013.01); *H01L 33/06* (2013.01); *H01L 51/502* (2013.01); *B29D 11/00788* (2013.01); *B82Y 30/00* (2013.01); *G02F 1/133606* (2013.01); *G02F 2001/01791* (2013.01); *G02F 2001/133614* (2013.01); *G02F 2001/133622* (2013.01); *G02F 2001/136222* (2013.01); *G02F 2202/36* (2013.01); *G02F 2202/38* (2013.01); *H01J 2329/326* (2013.01)

(58) Field of Classification Search
CPC ..... G02F 2001/136222; G02F 2202/36; G02F 2202/38; G02B 5/201; G02B 5/223; H01J 2329/326; H05K 2201/10136; B01B 31/0453; B01B 31/0484; C23C 16/26; C23C 18/1295; C23C 18/14; C23C 20/06
See application file for complete search history.

(56) References Cited

U.S. PATENT DOCUMENTS

| | | | | |
|---|---|---|---|---|
| 9,823,510 | B2* | 11/2017 | Zhang | G02F 1/133617 |
| 2004/0195573 | A1* | 10/2004 | Kim | G02F 1/136227 257/72 |
| 2004/0253526 | A1* | 12/2004 | Shih | G02F 1/133516 430/7 |
| 2010/0092892 | A1* | 4/2010 | Kurita | C08F 265/06 430/321 |
| 2010/0222473 | A1* | 9/2010 | Youn | G02F 1/133345 524/105 |
| 2011/0086310 | A1* | 4/2011 | Yukawa | G03F 7/0233 430/270.1 |
| 2012/0194933 | A1* | 8/2012 | Wu | G02B 5/201 359/891 |
| 2013/0077031 | A1* | 3/2013 | Kim | G02F 1/13394 349/106 |
| 2014/0063631 | A1* | 3/2014 | Lu | G02F 1/133514 359/891 |
| 2015/0029607 | A1* | 1/2015 | Lee | C23C 16/01 359/891 |
| 2015/0055238 | A1* | 2/2015 | Chen | G02B 5/23 359/891 |
| 2015/0111981 | A1* | 4/2015 | Fu | C08F 212/08 522/39 |
| 2015/0125786 | A1* | 5/2015 | Lee | G02F 1/133516 430/7 |
| 2015/0219965 | A1* | 8/2015 | Dong | G02F 1/133617 349/69 |
| 2015/0240118 | A1* | 8/2015 | Wu | C09D 179/04 524/157 |
| 2015/0285968 | A1* | 10/2015 | Zha | G02F 1/133512 359/891 |
| 2015/0293280 | A1* | 10/2015 | Lee | G02B 5/201 359/891 |
| 2015/0301408 | A1* | 10/2015 | Li | G02F 1/133621 362/84 |
| 2015/0309359 | A1* | 10/2015 | Wu | G02F 1/133514 359/891 |
| 2015/0355501 | A1* | 12/2015 | Lee | C23C 16/01 427/122 |
| 2015/0362794 | A1* | 12/2015 | Pang | G02F 1/133514 359/891 |
| 2016/0042702 | A1* | 2/2016 | Hirakata | H01L 27/3269 345/205 |
| 2016/0152893 | A1* | 6/2016 | Ogawa | C09K 19/3066 349/106 |
| 2016/0178951 | A1* | 6/2016 | Lee | G02F 1/13394 349/43 |
| 2016/0215212 | A1* | 7/2016 | Lee | G03F 7/0007 |
| 2016/0215213 | A1* | 7/2016 | Lee | C09K 11/883 |
| 2016/0222165 | A1* | 8/2016 | Wakita | G02B 5/20 |
| 2016/0244577 | A1* | 8/2016 | Zhang | C09J 163/00 |
| 2016/0252812 | A1* | 9/2016 | Yamada | G03F 7/0046 257/40 |
| 2016/0280968 | A1* | 9/2016 | Lee | C09J 9/02 |
| 2016/0291393 | A1* | 10/2016 | Han | G02F 1/133377 |
| 2016/0362602 | A1* | 12/2016 | Xin | C09K 11/02 |
| 2016/0377898 | A1* | 12/2016 | Xu | G02F 1/13338 349/12 |
| 2017/0003423 | A1* | 1/2017 | Jiang | G02B 5/201 |
| 2017/0045776 | A1* | 2/2017 | Zhu | G02F 1/1335 |
| 2017/0090247 | A1* | 3/2017 | Lee | G02F 1/133617 |
| 2017/0102487 | A1* | 4/2017 | Lee | G02B 5/206 |
| 2017/0102578 | A1* | 4/2017 | Shin | G02F 1/133512 |
| 2017/0123120 | A1* | 5/2017 | Shirouchi | G02B 5/223 |
| 2017/0123317 | A1* | 5/2017 | Kamura | G03F 7/039 |
| 2017/0146847 | A1* | 5/2017 | Liu | G02F 1/13439 |
| 2017/0146856 | A1* | 5/2017 | Yokota | G02F 1/133514 |
| 2017/0158957 | A1* | 6/2017 | Hong | C09K 11/7739 |
| 2017/0176811 | A1* | 6/2017 | Gu | G02F 1/133514 |
| 2017/0242167 | A1* | 8/2017 | Jia | G02B 5/201 |
| 2017/0255054 | A1* | 9/2017 | Li | G02F 1/133514 |
| 2017/0261789 | A1* | 9/2017 | Deng | G02F 1/1368 |
| 2017/0261849 | A1* | 9/2017 | Tang | G03F 7/0007 |
| 2017/0269434 | A1* | 9/2017 | Zhang | G02F 1/133617 |

* cited by examiner

METHODS OF FABRICATING QUANTUM DOT COLOR FILM SUBSTRATES

FIELD OF THE INVENTION

The present application relates to display technical field, specifically to a method of fabricating a quantum dot color film substrate.

BACKGROUND OF THE INVENTION

Due to thin film transistor liquid crystal displays (TFT-LCD) having advantages of high colorfulness, less volume, and low power consumption, they are dominant in current flat panel displays. As one important component of the liquid crystal display, a color filter filters light mainly through RGB color layer to achieve color. The RGB color layer of conventional TFT-LCD is mainly formed through exposure and development by utilizing yellow light lithography, there are problems of complex processes and longer time consumption; the color photoresist layer has lower backlight utilization; and due to limitation of the material itself, brightness and color saturation of the display is hard to obtain a greater enhancement.

Quantum Dots (QDs) refer to semiconductor crystal particles of diameters in 1-100 nm. Due to the less diameter of QDs, less than or close to exciton Bohr radius of corresponding bulk material produces quantum confinement effect, continuous band structure of the bulk material will be converted into discrete energy level structure, and electrons transition and fluorescence emission will occur in excitation of external light. Such special discrete energy level structure of QDs allows half wave width thereof being narrower, so they can emit monochrome light of higher purity, and have higher luminous efficiency compared with the conventional displays. Simultaneously, since sizes of QDs affects band gap of their energy levels, light of various wavelengths can be excited to emit by adjusting the dimensions of QDs or using QDs of different ingredients. In order to meet demands of people requiring display of high color saturation and wide color gamut, to add photoluminescence quantum dot device in backlight structures become an effective selection for major display manufacturers.

Additionally, the electrode material of indium tin oxide (ITO), which is extensively used in TFT-LCD, is currently faced with trends of fewer resource and increasing price; and ITO is flexure intolerance, it cannot meet curved surface design of panel, the characteristics of the material itself restricts to further thin or lighten the panel.

Graphene is a novel carbon nanomaterial, which is a monolayer network structure composed of carbon molecules, and has characteristics of good electron conductivity, low impedance, high transmittance, fine chemical stability, excellent mechanical performance. Raw material graphite for preparing the graphene have wide sources and cheap prices, and the graphene can undergo simple screen flexure or curved surface design, these excellent characteristics allow the graphene become a mainstream material for replacing ITO.

SUMMARY OF THE INVENTION

An aspect of the present application is to provide a method of fabricating a quantum dot color film substrate, including formulating quantum dots into quantum dot ink, performing formation of the ink by inkjet printing, to obtain a color filter layer, wherein the quantum ink at least has an ink of epoxy resin system, when the ink of epoxy resin system is yet cured, a graphene conductive layer is formed thereon to act as an electrode, so that a greatly improved adhesion of the graphene conductive layer and the color filter layer can be obtained.

To achieve the above aspect, the present application provides a method of fabricating a quantum dot color film substrate, including following steps:

step 1, providing a transparent substrate; partitioning the transparent substrate into side by side arranged red pixel regions, green pixel regions and transparent pixel regions;

step 2, forming a patterned organic transparent photoresist layer corresponding to the transparent pixel regions on the transparent substrate;

step 3, providing a red quantum dot ink and a green quantum dot ink; the red quantum dot ink and the green quantum dot ink at least having an ink of epoxy resin system therein, the ink of epoxy resin system having a prescription as follows:

an epoxy resin of 40-65 wt %;
a curing agent of 1-15 wt %;
an accelerating agent of 0.3-8 wt %;
a diluting agent of 10-20 wt %;
pigments of 3-12 wt %;
quantum dots of 1-10 wt %;

coating the red quantum dot ink corresponding to the red pixel regions on the transparent substrate by way of inkjet printing, to form a patterned red quantum dot layer, coating the green quantum dot ink corresponding to the green pixel regions on the transparent substrate by way of inkjet printing, to form a patterned green quantum dot layer, so as to obtain a color filter layer including the organic transparent photoresist layer, the red quantum dot layer and the green quantum dot layer;

step 4, forming a graphene conductive layer on the color filter layer when the ink of epoxy resin system is yet cured, to increase adhesion of the graphene conductive layer and the color filter layer; then, completely curing the ink of epoxy resin system on the transparent substrate by one or two ways of UV curing and thermosetting;

step 5, forming a black photoresist layer on the graphene conductive layer, the black photoresist layer including a black matrix, and main spacers and auxiliary spacers located on the black matrix.

The red quantum dot ink and the green quantum dot ink have viscosities in 1-40 cp, and surface tensions in 30~70 dy/cm.

In the ink of epoxy resin system, the epoxy resin is bisphenol A epoxy resin E44, bisphenol A epoxy resin E51, bisphenol A epoxy resin E54, bisphenol A epoxy resin EPON826 or bisphenol A epoxy resin EPON828.

The curing agent is hexahydrophthalic anhydride, tetrahydrophthalic anhydride, butanedihydrazide, adipic dihydrazide, dicyanodiamide or p-phenylenediamine.

The accelerating agent is 2-ethyl-4-methylimidazole, imidazole, dimethylimidazole or triethylamine.

The diluting agent is one of isopropyl alcohol, acetone, n-butyl alcohol, glycol ether, ethyl acetate, methyl ethyl ketone, methyl isobutyl ketone, ethylene glycol monomethyl ether, propylene glycol monomethyl ether, propylene glycol methyl ether acetate, propylene glycol monomethyl ether acetate, or a combination thereof.

The pigments are one of red, green and yellow pigments, or a combination thereof according to display requirement, the red, green and yellow pigments respectively are one of monoazo yellow and orange pigment, disazo pigment, naphthol series pigment, naphthol AS series pigment, azo lake based pigment, azo condensation pigment, benzimidazolone pigment, phthalocyanine pigment, thioindigo pigment, quinacridone based pigment, quinophthalone based pigment, anthraquinone pigment, dioxazine pigment, triarylmethane based pigment, and diketopyrrolo pyrrole based pigment, or a combination thereof.

The quantum dots corresponding to red and green quantum dot inks respectively are quantum dots of emitting red light and green light, a material of the quantum dots includes one or more than one of II-VI groups quantum dot material, and one or more than one of I-III-VI groups quantum dot material; structures of the quantum dots are spherical, core-shell type, spheroidal with convex, or irregular shape.

The red pigments are one of PR264, PR254, PR224, PR190, PR179, PR177, PR123, PR122, or a combination thereof; the green pigments are one of PG58, PG37, PG36, PG7, or a combination thereof; the yellow pigments are one of PY180, PY174, PY150, PY139, PY138, PY126, PY109, PY95, PY93, PY83, PY13, PY12, PY1, or a combination thereof.

The material of the quantum dots includes one or more than one of CdSe, CdS, CdTe, ZnS, ZnSe, CuInS, ZnCuInS.

One of the red quantum dot ink and the green quantum dot ink is an ink of photosensitive resin system, the ink of photosensitive resin system has a prescription as follows:
  a dispersion resin of 1-16 wt %;
  monomers of 1-16 wt %;
  a photoinitiator of 0.5-12 wt %;
  a solvent of 30-85 wt %;
  pigments of 3-12 wt %;
  quantum dots of 1-10 wt %;
wherein the dispersion resin is one of hexamethylene diacrylate, di(propylene glycol) diacrylate, tri(propylene glycol) diacrylate, trimethylolpropane triacrylate, ethoxylated trimethylolpropane triacrylate, pentaerythritol tetraacrylate, di(trimethylol propane) tetraacrylate, and dipentaerythritol pentaacrylate, or a combination thereof;

the monomers are one of methacrylate, acrylic acid, butenoic acid, maletic acid, maletic anhydride, styrene, methoxystyrene, methacrylate, methyl methacrylate, epoxypropyl acrylate and acrylonitrile, or a combination thereof;

the photoinitiator is one of benzophenone, 4-benzoylbiphenyl, benzoyl, methyl 2-benzoylbenzoate, benzoyl toluenesulfonate, ethyl 4-dimethylaminobenzoate, benzoyl methyl ether, benzoyl ethyl ether, benzoyl isopropyl ether, benzoyl isobutyl ether, 2,4,6-trimethylbenzoyl-diphenyl phosphine oxide, 2,2'-bis(2,4-dichlorophenyl)-4,4',5,5'-tetraphenyl-1,2'-biimidazole, 2-ethylanthraquinone, camphorquinone, benzyl, 4-hydroxyphenyl dimethyl sulfonium p-tosylate, triphenyl sulfonium hexafluoroantimonate, diphenyliodonium hexafluoroantimonate, 2-hydroxy-2-methyl-1-phenylpropyl-1-one, diethoxy acetyl phenol, 2-methyl-morpholino-1-(4-methyl-phenylthio), 2-hydroxy-2-methyl-1-[4-(ethylene-methyl)phenyl]propionate-1-one, 2,4-bis(chloroform-yl)-6-(tetra-methoxyphenoxy)-1,3,5-triazine, 2,4-bis(trichloromethyl)-6-piperonyl-1,3,5-triazine, 2,4-bis(chloroform)-6-[2-(5-methylfuran)-vinyl]-1,3,5-triazine, and 2-phenylethyl benzyl-2-yl-methyl-amine 1-(4-benzyl-morpholin-phenyl) butanone, or a combination thereof;

the solvent is one of cyclohexane, xylene, isopropyl alcohol, n-butyl alcohol, γ-butyrolactone, acetone, butanone, methyl ethyl ketone, methyl isobutyl ketone, fatty alcohol, ethylene glycol monomethyl ether, ethylene glycol monoethyl ether, ethylene glycol monopropyl ether, ethylene glycol monobutyl ether, propionic acid 3-ether acetate, ethylene glycol monomethyl ether, diethylene glycol diethyl ether ethyl acetate, butyl carbitol, butyl carbitol acetate, propylene glycol monomethyl ether, and propylene glycol monomethyl ether acetate, or a combination thereof;

the pigments, according to display demand, are one of red, green and yellow pigments, or a combination thereof, the red, green and yellow pigments respectively are one of monoazo yellow and orange pigments, disazopigment, naphthol series pigment, naphthol AS series pigment, azo lake pigment, azo condensation pigment, benzimidazolone pigment, phthalocyanine pigment, thioindigo pigment, quinacridone pigment, quinophthalone based pigment, anthraquinone pigment, dioxazine pigment, triarylmethane based pigment, and diketopyrrolo pyrrole based pigment, or a combination thereof;

the quantum dots corresponding to red, green quantum dot inks respectively are quantum dots of emitting red light and green light, a material of the quantum dots includes one or more than one of II-VI groups quantum dot material, and one or more than one of I-III-VI groups quantum dot material; structures of the quantum dots are spherical, core-shell type, spheroidal with convex, or irregular shape.

In step 4, the graphene conductive layer is formed by using transfer, inkjet orienting, spray coating, slit coating, or spin coating.

On the transparent substrate, the red pixel regions and the green pixel regions are spaced by the transparent pixel regions, each the red pixel region is located between two of the transparent pixel regions, each the green pixel region is located between two of the transparent pixel regions; in step 3, with the organic transparent photoresist layer as a barrier wall, coating the red and green quantum dot inks corresponding to the red and green pixel regions on the transparent substrate by the way of inkjet printing.

In step 3, for preventing overflow, coating thicknesses of the red quantum dot layer and the green quantum dot layer are set as 0.01-2 μm less than a thickness of the organic transparent photoresist layer.

In step 5, the black matrix includes longitudinal light shading bands and lateral light shading bands; the main spacers are disposed corresponding to the organic transparent photoresist layer above the lateral light shading bands, and the auxiliary spacers are disposed corresponding to the red quantum dot layer and the green quantum dot layer above the lateral light shading bands.

In step 2, a material of the organic transparent photoresist layer is a transparent photoresist material having UV curable, thermosetting, or simultaneously photo curable and thermosetting performance; the organic transparent layer is obtained through a yellow light lithography.

A ratio of an area of the transparent pixel regions (AT) to an area of the red pixel regions (AR) is in a range of $0.05 \leq AT/AR \leq 0.5$, a ratio of the area of the red pixel regions (AR) to an area of the green pixel regions (AG) is in a range of $0.3 \leq AR/AG \leq 1$.

The present application further provides a method of fabricating a quantum dot color film substrate, including following steps:
  step 1, providing a transparent substrate;
  partitioning the transparent substrate into side by side arranged red pixel regions, green pixel regions and transparent pixel regions;
  step 2, forming a patterned organic transparent photoresist layer corresponding to the transparent pixel regions on the transparent substrate;
  step 3, providing a red quantum dot ink and a green quantum dot ink; the red quantum dot ink and the green quantum dot ink having at least an ink of epoxy resin system therein, the ink of epoxy resin system having a prescription as follows:

an epoxy resin of 40-65 wt %;
a curing agent of 1-15 wt %;
an accelerating agent of 0.3-8 wt %;
a diluting agent of 10-20 wt %;
pigments of 3-12 wt %;
quantum dots of 1-10 wt %;

coating the red quantum dot ink corresponding to the red pixel regions on the transparent substrate by way of inkjet printing, to form a patterned red quantum dot layer, coating the green quantum dot ink corresponding to the green pixel regions on the transparent substrate by way of inkjet printing, to form a patterned green quantum dot layer, so as to obtain a color filter layer including the organic transparent photoresist layer, the red quantum dot layer and the green quantum dot layer;

step 4, forming a graphene conductive layer on the color filter layer when the ink of epoxy resin system is yet cured, to increase adhesion of the graphene conductive layer and the color filter layer; then, completely curing the ink of epoxy resin system on the transparent substrate by one or two ways of UV curing and thermosetting;

step 5, forming a black photoresist layer on the graphene conductive layer, the black photoresist layer including a black matrix, and main spacers and auxiliary spacers located on the black matrix;

wherein, in step 4, the graphene conductive layer is formed by using transfer, inkjet orienting, spray coating, slit coating, or spin coating;

wherein, on the transparent substrate, the red pixel regions and the green pixel regions are spaced by the transparent pixel regions, each the red pixel region is located between two of the transparent pixel regions, each the green pixel region is located between two of the transparent pixel regions; in step 3, with the organic transparent photoresist layer as a barrier wall, coating the red and green quantum dot inks corresponding to the red and green pixel regions on the transparent substrate by the way of inkjet printing;

wherein, in step 3, for preventing overflow, coating thicknesses of the red quantum dot layer and the green quantum dot layer are set as 0.01-2 μm less than a thickness of the organic transparent photoresist layer;

in step 5, the black matrix includes longitudinal light shading bands and lateral light shading bands; the main spacers are disposed corresponding to the organic transparent photoresist layer above the lateral light shading bands, and the auxiliary spacers are disposed corresponding to the red quantum dot layer and the green quantum dot layer above the lateral light shading bands;

wherein, in step 2, a material of the organic transparent photoresist layer is a transparent photoresist material having UV curable, thermosetting, or simultaneously photo curable and thermosetting performance; the organic transparent layer is obtained through a yellow light lithography.

Advantages of the present application: the present application provides a method of fabricating a quantum dot color film substrate, red and green quantum dots are respectively formulating into red and green quantum dot inks, then formation is performed by an inkjet printing, and a color filter layer is obtained, thereby brightness and color saturation of displays can be increased; simultaneously, the red quantum dot ink and the green quantum dot ink at least have an ink of epoxy resin system therein, when the ink of epoxy resin system is yet cured, a graphene conductive layer is formed thereon to act as an electrode, so that a greatly improved adhesion of the graphene conductive layer and the color filter layer can be obtained; additionally, to replace ITO by utilizing graphene as a conductive layer can alleviate current issues of few ITO sources and increasing price, and the graphene has conductivity and high transmittance that make display quality of TFT-LCD screen be guaranteed, and an overall thinned and lightened panel be achieved, such design helps increasing conductivity and integrating benefits, and also has very great application prospect in curved panel market.

For further illustrating features and techniques of the present application, please refer to following detail descriptions and accompanying drawings relative to the invention, however, the accompanying drawings are not intended to be exhaustive or to be limited to the present application.

BRIEF DESCRIPTION OF THE DRAWINGS

The technical features and advantages of the present application will become more readily apparent through the detailed description of embodiments and following accompanying drawings, in which.

DETAILED DESCRIPTION OF PREFERRED EMBODIMENTS

For further illustrating the techniques and effects adopted by the present application, the preferable embodiments of the present application and accompanying drawings will be described in more detail as follows.

Figure 1:
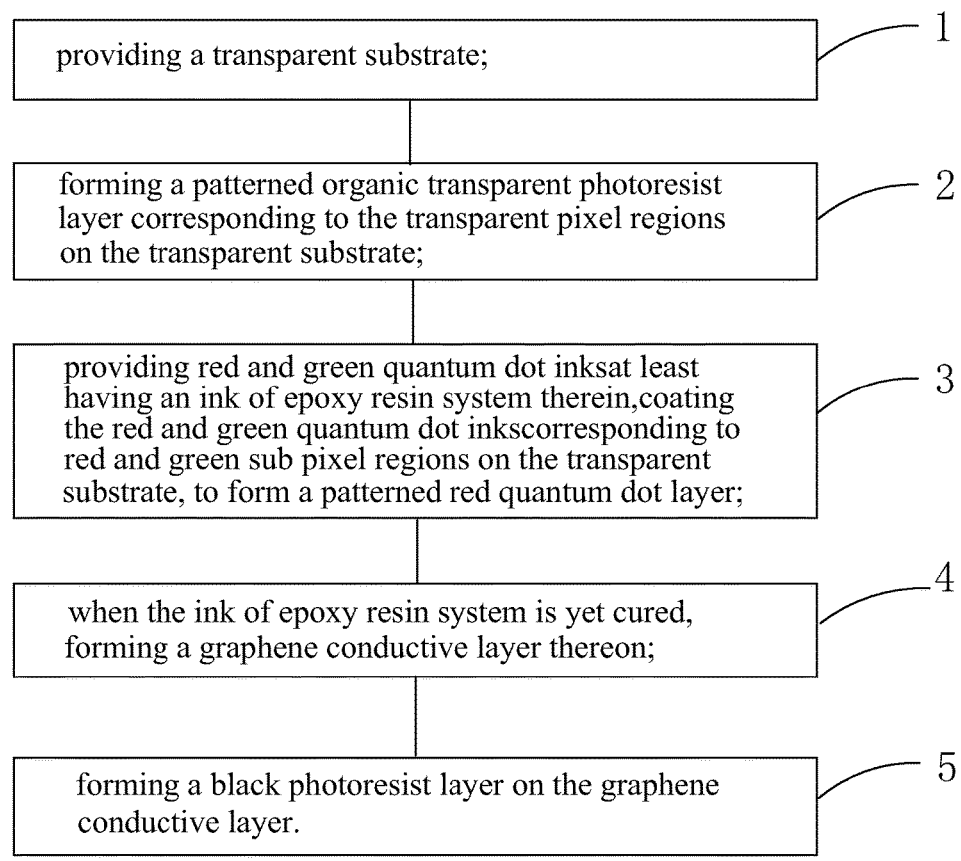
FIG. 1 is a flow chart illustrating a method of fabricating a quantum dot color film substrate of the present application.
Figure 2:
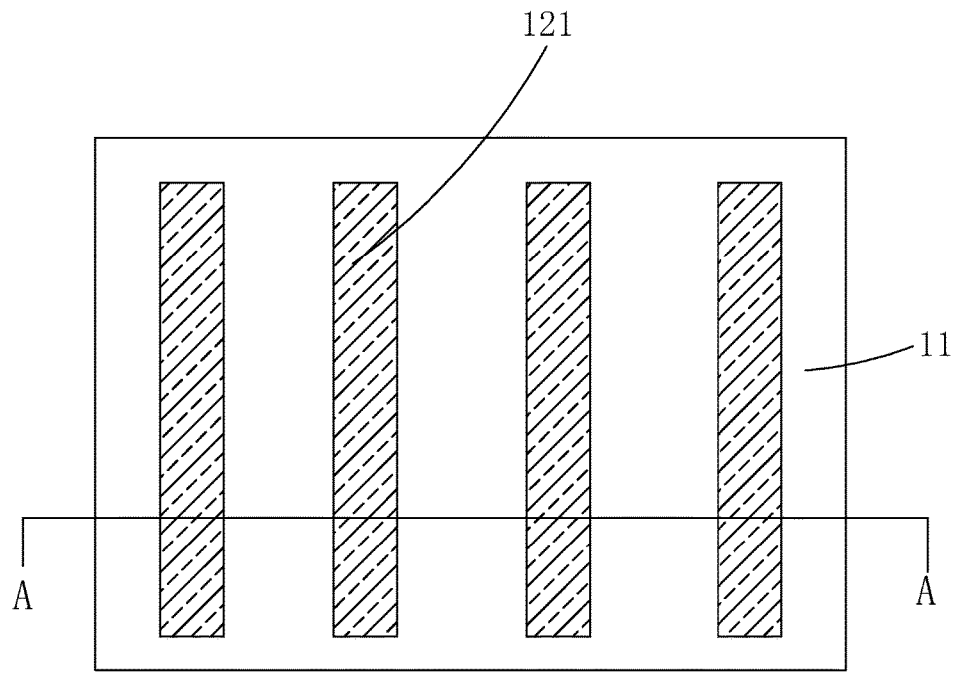
FIG. 2 is a schematic diagram illustrating forming an organic transparent photoresist layer in step 2 of the method of fabricating the quantum dot color film substrate of the present application.
Figure 3:
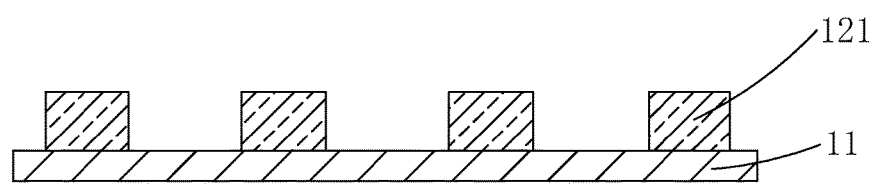
FIG. 3 is a schematic diagram illustrating a cross sectional view of the organic transparent photoresist layer formed on a substrate in step 2 of the present application, along line A-A in FIG. 2.

Please refer to FIG. 1, the present application firstly provides a method of fabricating a quantum dot color film substrate, including following steps:

step 1, providing a transparent substrate 11;

partitioning the transparent substrate 11 into side by side arranged red pixel regions, green pixel regions and transparent pixel regions;

specifically, on the transparent substrate 11, the red pixel regions and the green pixel regions are spaced by the transparent pixel regions, each the red pixel region is located between two of the transparent pixel regions, each the green pixel region is located between two of the transparent pixel regions;

specifically, in order to use the quantum dot color film in a display device to perform color display, a white point color coordinate is adjusted to a target range ($0.25<x<0.35$, $0.24<y<0.35$), to control a ratio of an area of the transparent pixel regions (AT) to an area of the red pixel regions (AR) is in a range of 0.05≤AT/AR≤0.5, a ratio of the area of the red pixel regions (AR) to an area of the green pixel regions (AG) is in a range of 0.3≤AR/AG≤1;

step 2, as shown in FIGS. 2-3, forming a patterned organic transparent photoresist layer 121 corresponding to the transparent pixel regions on the transparent substrate 11;

specifically, in step 2, a material of the organic transparent photoresist layer 121 is a transparent photoresist material having UV curable, thermosetting, or simultaneously photo curable and thermosetting performance; the organic transparent layer 121 is obtained through a yellow light lithography.

Step 3, providing a red quantum dot ink and a green quantum dot ink; the red quantum dot ink and the green quantum dot ink at least having an ink of epoxy resin system therein, the ink of epoxy resin system having a prescription as follows:

an epoxy resin of 40-65 wt %; a curing agent of 1-15 wt %; an accelerating agent of 0.3-8 wt %; a diluting agent of 10-20 wt %; pigments of 3-12 wt %; quantum dots of 1-10 wt %;

with the organic transparent photoresist layer 121 as a barrier wall, coating the red quantum dot ink corresponding to the red pixel regions on the transparent substrate 11 by way of inkjet printing, to form a patterned red quantum dot layer 122, coating the green quantum dot ink corresponding to the green pixel regions on the transparent substrate 11 by way of inkjet printing, to form a patterned green quantum dot layer 123, so as to obtain a color filter layer 12 including the organic transparent photoresist layer 121, the red quantum dot layer 122 and the green quantum dot layer 123;

specifically, as shown in FIGS. 2-3, after step 2, both the red pixel region and the green pixel region are located within the barrier wall consisting of two of the organic transparent photoresist layer 121, with the organic transparent photoresist layer 121 as the barrier wall to perform inkjet printing, precision of spray coating can be greatly improved, and the use of inkjet printing to form the quantum dot layer is a simple process, short time-consuming and relatively low equipment cost; at the same time, the organic transparent photoresist layer 121 itself can transmit blue light of a backlight source, so as to increase an aperture ratio of the display, and utilization of the light source; an use of the quantum dot materials to replace conventional red filter layer and green filter layer increases the utilization of the light source; simultaneously, an use of narrower half-wave width of the quantum dot materials can obtain light of higher color purity, so that high color gamut and low power consumption of the display can be achieved;

specifically, in the ink of epoxy resin system, the epoxy resin can be bisphenol A epoxy resin E44, bisphenol A epoxy resin E51, bisphenol A epoxy resin E54, bisphenol A epoxy resin EPON826 or bisphenol A epoxy resin EPON828; the curing agent can be hexahydrophthalic anhydride, tetrahydrophthalic anhydride, butanedihydrazide, adipic dihydrazide, dicyanodiamide or p-phenylenediamine; the accelerating agent can be 2-ethyl-4-methylimidazole, imidazole, dimethylimidazole or triethylamine; the diluting agent can be one of isopropyl alcohol, acetone, n-butyl alcohol, glycol ether, ethyl acetate, methyl ethyl ketone, methyl isobutyl ketone, ethylene glycol monomethyl ether, propylene glycol monomethyl ether, propylene glycol methyl ether acetate, propylene glycol monomethyl ether acetate, or a combination thereof; the pigments, according to display requirement, can be selected from one of red, green and yellow pigments, or a combination thereof, a composition of the pigments does not have special limitation, current organic pigments can be selected as the aforesaid pigments: monoazo yellow and orange pigment, disazo pigment, naphthol series pigment, naphthol AS series pigment, azo lake based pigment, azo condensation pigment, benzimidazolone pigment, phthalocyanine pigment, thioindigo pigment, quinacridone based pigment, quinophthalone based pigment, anthraquinone pigment, dioxazine pigment, triarylmethane based pigment, and diketopyrrolo pyrrole based pigment, etc., more preferably, the red pigments are selected from one or more than one of PR264, PR254, PR224, PR190, PR179, PR177, PR123, PR122, the green pigments are selected from one or more than one of PG58, PG37, PG36, PG7, if the pigments are a mixture of red pigments and yellow pigments, the yellow pigments therein can be selected from one or more than one of PY180, PY174, PY150, PY139, PY138, PY126, PY109, PY95, PY93, PY83, PY13, PY12, PY1; a material of the quantum dots can be selected from II-VI groups quantum dot material and I-III-VI groups quantum dot material, further preferably, one or more than one of CdSe, CdS, CdTe, ZnS, ZnSe, CuInS, ZnCuInS, structures of the quantum dots are spherical, core-shell type, spheroidal with convex, or irregular shape, etc.; specifically, the quantum dots corresponding to red, green quantum dot inks respectively are quantum dots of emitting red light and green light, by controlling diameters of the quantum dots, light emitting from the excited quantum dots can be adjusted.

Specifically, one of the red quantum dot ink and the green quantum dot ink is an ink of photosensitive resin system, which has a prescription as follows:

a dispersion resin of 1-16 wt %; monomers of 1-16 wt %; a photoinitiator of 0.5-12 wt %; a solvent of 30-85 wt %; pigments of 3-12 wt %; quantum dots of 1-10 wt %;

wherein the dispersion resin is selected from one or more than one of hexamethylene diacrylate, di(propylene glycol) diacrylate, tri(propylene glycol) diacrylate, trimethylolpropane triacrylate, ethoxylated trimethylolpropane triacrylate, pentaerythritol tetraacrylate, di(trimethylol propane) tetraacrylate, and dipentaerythritol pentaacrylate; the monomers are selected from one or more than one of methacrylate, acrylic acid, butenoic acid, maletic acid, maletic anhydride, styrene, methoxystyrene, methacrylate, methyl methacrylate, epoxypropyl acrylate and acrylonitrile; the photoinitiator is selected from one or more than one of benzophenone, 4-benzoylbiphenyl, benzoyl, methyl 2-benzoylbenzoate, benzoyl toluenesulfonate, ethyl 4-dimethylaminobenzoate, benzoyl methyl ether, benzoyl ethyl ether, benzoyl isopropyl ether, benzoyl isobutyl ether, 2,4,6-trimethylbenzoyl-diphenyl phosphine oxide, 2,2'-bis(2,4-dichlorophenyl)-4,4',5,5'-tetraphenyl-1,2'-biimidazole, 2-ethylanthraquinone, camphorquinone, benzyl, 4-hydroxyphenyl dimethyl sulfonium p-tosylate, triphenyl sulfonium hexafluoroantimonate, diphenyliodonium hexafluoroantimonate, 2-hydroxy-2-methyl-1-phenylpropyl-1-one, diethoxy acetyl phenol, 2-methyl-morpholino-1-(4-methylphenylthio), 2-hydroxy-2-methyl-1-[4-(ethylene-methyl)phenyl]propionate-1-one, 2,4-bis (chloroform-yl)-6-(tetramethoxyphenoxy)-1,3,5-triazine, 2,4-bis (trichloromethyl)-6-piperonyl-1,3,5-triazine, 2,4-bis(chloroform)-6-[2-(5-methylfuran)-vinyl]-1,3,5-triazine, and 2-phenylethyl benzyl-2-yl-methyl-amine 1-(4-benzyl-morpholin-phenyl)butanone; the solvent is selected from one or more than one of cyclohexane, xylene, isopropyl alcohol, n-butyl alcohol, γ-butyrolactone, acetone, butanone, methyl ethyl ketone, methyl isobutyl ketone, fatty alcohol, ethylene glycol monomethyl ether, ethylene glycol monoethyl ether, ethylene glycol monopropyl ether, ethylene glycol monobutyl ether, propionic acid 3-ether acetate, ethylene glycol monomethyl ether, diethylene glycol diethyl ether ethyl acetate, butyl carbitol, butyl carbitol acetate, propylene glycol monomethyl ether, and propylene glycol monomethyl ether acetate; the pigments, according to display demand, are selected from one or more than one of red, green and yellow pigments, a composition of the pigments does not have special limitation, current organic pigments can be selected as the aforesaid pigments: monoazo yellow and orange pigment, disazo pigment, naphthol series pigment, naphthol AS series pigment, azo lake based pigment, azo condensation pigment, benzimidazolone pigment, phthalocyanine pigment, thioindigo pigment, quinacridone based pigment, quinophthalone based pigment, anthraquinone pigment, dioxazine pigment, triarylmethane based pigment, and diketopyrrolo pyrrole based pigment, etc., more preferably, the red pigments are selected from one or more than one of PR264, PR254, PR224, PR190, PR179, PR177, PR123, PR122, the green pigments are selected from one or more than one of PG58, PG37, PG36, PG7, if the pigments are a mixture of red pigments and yellow pigments, the yellow pigments therein can be selected from one or more than one of PY180, PY174, PY150, PY139, PY138, PY126, PY109, PY95, PY93, PY83, PY13, PY12, PY1; a material of the quantum dots can be selected from II-VI groups quantum dot material and I-III-VI groups quantum dot material, further preferably, one or more than one of CdSe, CdS, CdTe, ZnS, ZnSe, CuInS, ZnCuInS, structures of the quantum dots are spherical, core-shell type, spheroidal with convex, or irregular shape, etc.; specifically, the quantum dots corresponding to red, green quantum dot inks respectively are quantum dots of emitting red light and green light, by controlling diameters of the quantum dots, light emitting from the excited quantum dots can be adjusted.

Specifically, the formulated red and green quantum dot inks have viscosities in 1-40 cp, and surface tensions in 30~70 dy/cm.

Specifically, in step 3, if one of the red and green quantum dot inks is an ink of non-epoxy resin system, spray coating of the ink is at first, after the spray coating is performed, a step of UV curing and/or thermosetting is further included therein so as to cure it into formation; then, spray coating of the ink of epoxy resin is thereafter.

Specifically, in step 3, for preventing overflow, coating thicknesses of the red quantum dot layer 122 and the green quantum dot layer 123 are set as 0.01-2 μm less than a thickness of the organic transparent photoresist layer 121.

Step 4, when the ink of epoxy resin system is yet cured, forming a graphene conductive layer 13 on the color filter layer 12 by using ways of transfer, inkjet orienting, spray coating, slit coating, or spin coating, etc., to increase adhesion of the graphene conductive layer 13 and the color filter layer 12; then, completely curing the ink of epoxy resin system on the transparent substrate 11 by one or two ways of UV curing and thermosetting; before the ink of epoxy resin system is cured, to form the graphene layer thereon can greatly increase the adhesion of the graphene and the color filter layer 12; additionally, to replace ITO by utilizing graphene as a conductive layer can alleviate current issues of few ITO sources and increasing price, and the graphene has conductivity and high transmittance that make display quality of TFT-LCD screen be guaranteed, and in terms of thinning and lightening an overall panel can be achieved.

Figure 4:
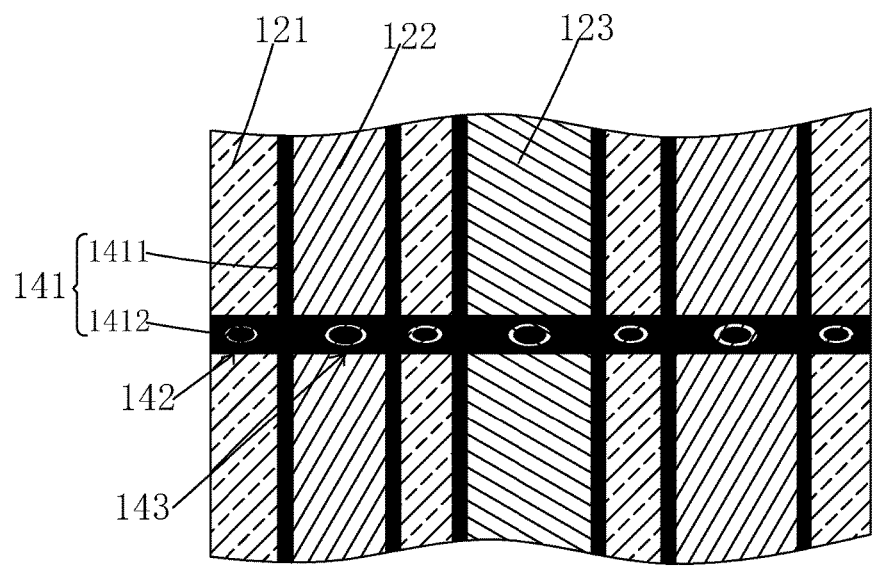
FIG. 4 is a schematic diagram illustrating step 5 of the method of fabricating the quantum dot color film substrate of the present application.
Figure 5:
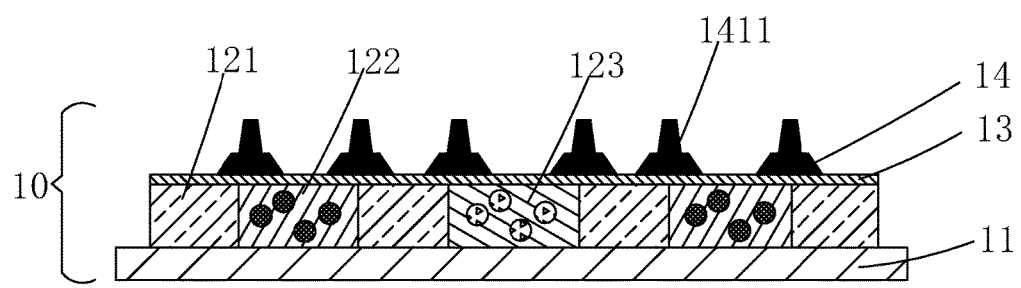
FIG. 5 is a schematic diagram illustrating a structure of the quantum dot color film substrate fabricated according to the present application.

Step 5, as shown in FIG. 4, forming a black photoresist layer 14 on the graphene conductive layer 13, to obtain a quantum dot color film substrate 10 as shown in FIG. 5; the black photoresist layer 14 includes a black matrix, and main spacers 142 and auxiliary spacers 143 on the black matrix 141.

Specifically, the black matrix 141 includes longitudinal light shading bands 1411 and lateral light shading bands 1412, the longitudinal light shading bands 1411 are used for blocking overlap area between respective pixel regions, to prevent color mixing; the lateral light shading bands 1412 are used for respectively partitioning the red quantum dot layer 122, the green quantum dot layer 123 and the organic transparent photoresist layer 121 into sub pixel regions.

Specifically, the main spacers 142 and the auxiliary spacers 143 are used for controlling a thickness and uniformity between upper and lower substrates of the liquid crystal display.

Specifically, using ascendancy of the organic transparent photoresist layer 121 higher than the red quantum dot layer 122 and the green quantum dot layer 123, to dispose the main spacers 142 corresponding to the organic transparent photoresist layer 121 above the lateral light shading bands 1412, and the auxiliary spacers 143 are disposed corresponding to the red quantum dot layer 122 and the green quantum dot layer 123 above the lateral light shading bands 1412, without other special design, a larger level difference can be formed between the main spacers 142 and the auxiliary spacers 143, to meet a liquid crystal margin demand of forming a cell.

In a preferable embodiment of the method of fabricating the color film substrate of the present application, a thickness of the organic transparent photoresist layer 121 formed in step 2 is 4 μm; in step 3, the red quantum dot ink provided is selected from an ink of photo-sensitive resin system, in which ratios of respective components are: the dispersion resin of 10 wt %, the monomers of 6 wt %, the photoinitiator of 8 wt %, the solvent of 61 wt %, the pigments of 6 wt %, the quantum dots of 9 wt %; the green quantum dot ink provided is selected from an ink of epoxy resin system, in which ratios of respective components are: the epoxy resin of 55 wt %, the curing agent of 8 wt %, the accelerating agent of 6.5 wt %, the diluting agent of 15 wt %, the pigments of 7.5 wt %, the quantum dots of 8 wt %; then in step 3, coating the red quantum dot ink corresponding to the red pixel regions on the transparent substrate 11 by way of inkjet printing, and curing the red quantum dot ink by hybrid of UV curing and thermosetting, after the ink is cured, then coating the green quantum dot ink corresponding to the green pixel regions on the transparent substrate 11 by way of inkjet printing, and then performing step 4, forming a graphene conductive layer on the color filter layer 12 by way of transfer followed by thermosetting the green quantum dot ink; and in step 3, for preventing overflow, the coating thicknesses of the red quantum dot layer is set as 0.2 μm less than the thickness of the organic transparent photoresist layer 121, the coating thicknesses of the green quantum dot layer 123 is set as 0.2 μm less than the thickness of the organic transparent photoresist layer 121; additionally, when the quantum dot color film substrate used in the display device performs displaying, a white point color coordinate is adjusted to a target range ($0.25<x<0.35$, $0.24<y<0.35$), the ratio (AT/AR) of the area of the transparent pixel regions (AT) to the disposed area of the red pixel regions (AR) disposed is set as 0.5, a ratio (AR/AG) of the area of the red pixel regions (AR) to an area of the green pixel regions (AG) is set as 1.

In another preferable embodiment of the method of fabricating the color film substrate of the present application, a thickness of the organic transparent photoresist layer 121 formed in step 2 is 3.5 μm; in step 3, the green quantum dot ink provided is selected from an ink of photo-sensitive resin system, in which ratios of respective components are: the dispersion resin of 9 wt %, the monomers of 5 wt %, the photoinitiator of 7.5 wt %, the solvent of 62 wt %, the pigments of 7 wt %, the quantum dots of 9.5 wt %; the red quantum dot ink provided is selected from an ink of epoxy resin system, in which ratios of respective components are: the epoxy resin of 52 wt %, the curing agent of 7 wt %, the accelerating agent of 7.5 wt %, the diluting agent of 18 wt %, the pigments of 8 wt %, the quantum dots of 7.5 wt %; then in step 3, coating the green quantum dot ink corresponding to the green pixel regions on the transparent substrate 11 by way of inkjet printing, and curing the green quantum dot ink by hybrid of UV curing and thermosetting, after the ink is cured, then coating the red quantum dot ink corresponding to the red pixel regions on the transparent substrate 11 by way of inkjet printing, and then performing step 4, forming a graphene conductive layer on the color filter layer 12 by way of spray coating followed by thermosetting the red quantum dot ink; and in step 3, for preventing overflow, the coating thicknesses of the red quantum dot layer 122 is set as 0.15 μm less than the thickness of the organic transparent photoresist layer 121, the coating thicknesses of the green quantum dot layer 123 is set as 0.15 μm less than the thickness of the organic transparent photoresist layer 121; additionally, when the quantum dot color film substrate used in the display device performs displaying, a white point color coordinate is adjusted to a target range (0.25<x<0.35, 0.24<y<0.35), the ratio (AT/AR) of the area of the transparent pixel regions (AT) to the disposed area of the red pixel regions (AR) disposed is set as 0.45, a ratio (AR/AG) of the area of the red pixel regions (AR) to an area of the green pixel regions (AG) is set 1.

In a further preferable embodiment of the method of fabricating the color film substrate of the present application, a thickness of the organic transparent photoresist layer 121 formed in step 2 is 3.2 μm; in step 3, the red quantum dot ink provided is selected from an ink of epoxy resin system, in which ratios of respective components are: the epoxy resin of 48 wt %, the curing agent of 7.5 wt %, the accelerating agent of 8 wt %, the diluting agent of 20 wt %, the pigments of 8 wt %, the quantum dots of 8.5 wt %; the green quantum dot ink provided is selected from an ink of epoxy resin system, in which ratios of respective components are: the epoxy resin of 52 wt %, the curing agent of 7 wt %, the accelerating agent of 7.5 wt %, the diluting agent of 18 wt %, the pigments of 8 wt %, the quantum dots (QDs) of 7.5 wt %; in step 3, coating the red and green quantum dot inks corresponding to the red and green pixel regions on the transparent substrate 11 by way of inkjet printing, and then performing step 4, forming a graphene conductive layer on the color filter layer 12 by way of spray coating followed by thermosetting the red and green quantum dot inks; and in step 3, for preventing overflow, the coating thicknesses of the red quantum dot layer 122 is set as 0.1 μm less than the thickness of the organic transparent photoresist layer 121, the coating thicknesses of the green quantum dot layer 123 is set as 0.1 μm less than the thickness of the organic transparent photoresist layer 121; additionally, when the quantum dot color film substrate used in the display device performs displaying, a white point color coordinate is adjusted to a target range (0.25<x<0.35, 0.24<y<0.35), the ratio (AT/AR) of the area of the transparent pixel regions (AT) to the disposed area of the red pixel regions (AR) disposed is set as 0.4, a ratio (AR/AG) of the area of the red pixel regions (AR) to an area of the green pixel regions (AG) is set 0.9.

Based on the aforesaid method of fabricating the quantum dot color film substrate, as shown in FIG. 5, the quantum dot color film substrate 10 obtained by the present application includes the transparent substrate 11, the color filter layer 12 located on the transparent substrate 10, the graphene conductive layer 13 located on the color filter layer 12, and the black photoresist layer 14 located on the graphene layer 13;

Specifically, the color filter layer 12 includes side by side arranged the organic transparent photoresist layers 121, the red quantum dot layers 122 and the green quantum dot layers 123;

wherein the red quantum dot layers 122 and the green quantum dot layers 123 are spaced by the organic transparent photoresist layers 121, each the red quantum dot layer 122 is located between two of the organic transparent photoresist layers 121, each the green quantum dot layer 123 is located between two of the organic transparent photoresist layers 121;

specifically, the black photoresist layer 15 includes a black matrix 141, and main spacers 142 and auxiliary spacers 143 located on the black matrix 141;

the black matrix 141 includes longitudinal light shading bands 1411 and lateral light shading bands 1412; the main spacers 142 are disposed corresponding to the organic transparent photoresist layer 121 above the lateral light shading bands 1412, and the auxiliary spacers 143 are disposed corresponding to the red quantum dot layer 122 and the green quantum dot layer 123 above the lateral light shading bands 1412.

Figure 6:
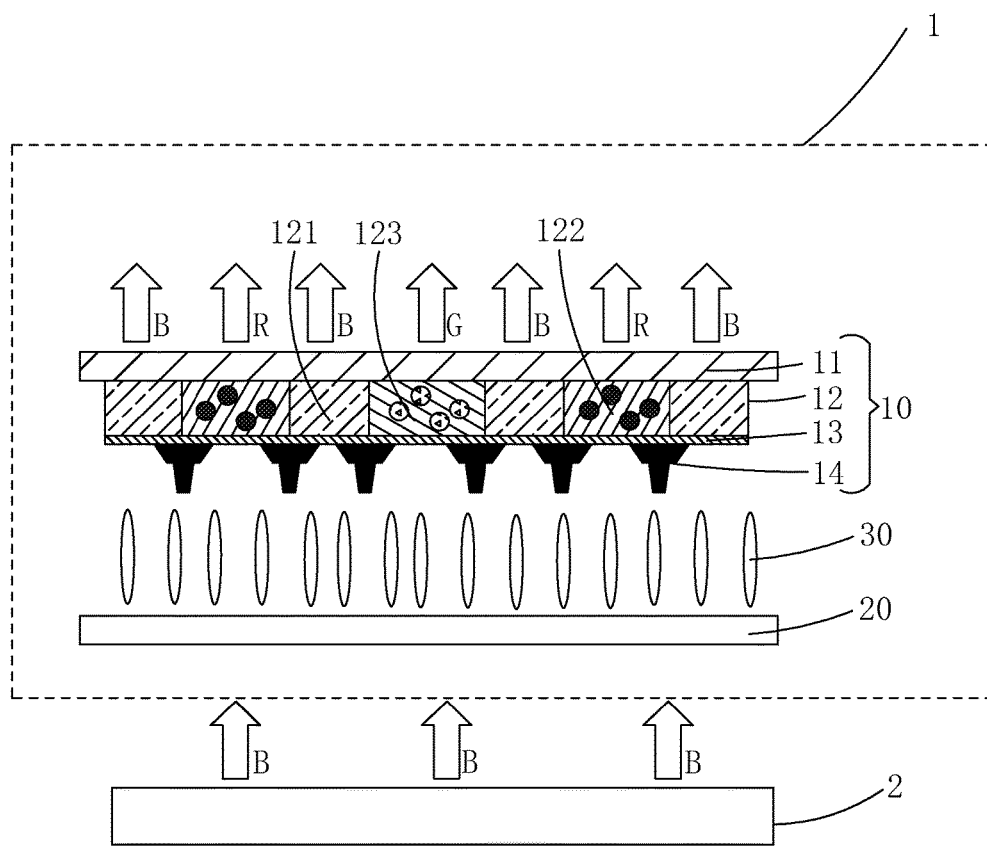
FIG. 6 is a schematic diagram illustrating the quantum dot color film substrate, fabricated according to the present application, performing color display in a liquid crystal display.

Specifically, the quantum dot color film substrate obtained by the present application is used in a liquid crystal device of blue backlight, as shown in FIG. 6, the liquid crystal device includes a liquid crystal panel 1, and a backlight module 2; the liquid crystal panel 1 includes the aforesaid quantum dot color film substrate 10, an array substrate 20, and a liquid crystal layer 30 located between the quantum dot color film substrate 10 and the array substrate 20; a blue light LED is used as a backlight source of the backlight module 2, a wavelength range of the backlight source is in 450-480 nm.

In the liquid crystal display device, on the quantum dot color film substrate 10, the organic transparent photoresist layer 121 corresponds to a pixel region, and can directly transmit the blue light of the backlight source, so as to effectively increase the aperture ratio of the display and the utilization of the light source; the red quantum layers 121 and the green quantum dot layers 122 includes the quantum dot materials, in comparison with red and green photoresists in conventional color film filter, that can increase the utilization of the light source; simultaneously, utilizing the excited light of the quantum dots having characteristic of narrower half-wave width can obtain light of higher color purity, so that high color gamut and low power consumption of the liquid crystal display can be achieved.

Specifically, the liquid crystal display device can be large-size liquid crystal displays, liquid crystal television, also be small and medium-size cell phones, tablet computers, digital cameras, or displays of other special performance, such as electronic paper, etc.

In summary, the method of fabricating the quantum dot color film substrate of the present application, red and green quantum dots are respectively formulating into red and green quantum dot inks, then formation is performed by an inkjet printing, and a color filter layer is obtained, thereby brightness and color saturation of displays can be increased; simultaneously, the red quantum dot ink and the green quantum dot ink at least have an ink of epoxy resin system therein, when the ink of epoxy resin system is yet cured, a graphene conductive layer is formed thereon to act as an electrode, so that a greatly improved adhesion of the graphene conductive layer and the color filter layer can be obtained; additionally, to replace ITO by utilizing graphene as a conductive layer can alleviate current issues of few ITO sources and increasing price, and the graphene has conductivity and high transmittance that make display quality of TFT-LCD screen be guaranteed, and an overall thinned and lightened panel be achieved, such design helps increasing conductivity and integrating benefits, and also has very great application prospect in curved panel market.

To those ordinarily skilled in the art, the above description is intended to cover various modifications and similar arrangements according to the technical solution and spirit of the present application, and the various modifications and similar arrangements are included within the spirit and scope of the appended claims of the present application.

What is claimed is:

1. A method of fabricating a quantum dot color film substrate, comprising following steps:
   step 1, providing a transparent substrate;
   partitioning the transparent substrate into side by side arranged red pixel regions, green pixel regions and transparent pixel regions;
   step 2, forming a patterned organic transparent photoresist layer corresponding to the transparent pixel regions on the transparent substrate;
   step 3, providing a red quantum dot ink and a green quantum dot ink; the red quantum dot ink and the green quantum dot ink at least having an ink of epoxy resin system therein, the ink of epoxy resin system having a prescription as follows:
   an epoxy resin of 40-65 wt %;
   a curing agent of 1-15 wt %;
   an accelerating agent of 0.3-8 wt %;
   a diluting agent of 10-20 wt %;
   pigments of 3-12 wt %;
   quantum dots of 1-10 wt %;
   coating the red quantum dot ink corresponding to the red pixel regions on the transparent substrate by way of inkjet printing, to form a patterned red quantum dot layer, coating the green quantum dot ink corresponding to the green pixel regions on the transparent substrate by way of inkjet printing, to form a patterned green quantum dot layer, so as to obtain a color filter layer comprising the organic transparent photoresist layer, the red quantum dot layer and the green quantum dot layer;
   step 4, forming a graphene conductive layer on the color filter layer when the ink of epoxy resin system is yet cured, to increase adhesion of the graphene conductive layer and the color filter layer; then, completely curing the ink of epoxy resin system on the transparent substrate by one or two ways of UV curing and thermosetting;
   step 5, forming a black photoresist layer on the graphene conductive layer, the black photoresist layer comprising a black matrix, and main spacers and auxiliary spacers located on the black matrix.

2. The method of fabricating the quantum dot color film substrate according to claim 1, wherein the red quantum dot ink and the green quantum dot ink have viscosities in 1-40 cp, and surface tensions in 30-70 dy/cm.

3. The method of fabricating the quantum dot color film substrate according to claim 1, wherein, in the ink of epoxy resin system, the epoxy resin is a bisphenol A epoxy resin;
   the curing agent is hexahydrophthalic anhydride, tetrahydrophthalic anhydride, butanedihydrazide, adipic dihydrazide, dicyanodiamide or p-phenylenediamine;
   the accelerating agent is 2-ethyl-4-methylimidazole, imidazole, dimethylimidazole or triethylamine;
   the diluting agent is one of isopropyl alcohol, acetone, n-butyl alcohol, glycol ether, ethyl acetate, methyl ethyl ketone, methyl isobutyl ketone, ethylene glycol monomethyl ether, propylene glycol monomethyl ether, propylene glycol methyl ether acetate, propylene glycol monomethyl ether acetate, or a combination thereof;
   the pigments are one of red, green and yellow pigments, or a combination thereof according to display requirement, the red, green and yellow pigments respectively are one of monoazo yellow and orange pigment, disazo pigment, naphthol series pigment, azo lake based pigment, azo condensation pigment, benzimidazolone pigment, phthalocyanine pigment, thioindigo pigment, quinacridone based pigment, quinophthalone based pigment, anthraquinone pigment, dioxazine pigment, triarylmethane based pigment, and diketopyrrolo pyrrole based pigment, or a combination thereof;
   the quantum dots corresponding to red and green quantum dot inks respectively are quantum dots of emitting red light and green light, a material of the quantum dots comprises one or more than one of II-VI groups quantum dot material, and one or more than one of I-III-VI groups quantum dot material; structures of the quantum dots are spherical, core-shell type, spheroidal with convex, or irregular shape.

4. The method of fabricating the quantum dot color film substrate according to claim 1, wherein, in step 4, the graphene conductive layer is formed by using transfer, inkjet orienting, spray coating, slit coating, or spin coating.

5. The method of fabricating the quantum dot color film substrate according to claim 1, wherein, on the transparent substrate, the red pixel regions and the green pixel regions are spaced by the transparent pixel regions, each the red pixel region is located between two of the transparent pixel regions, each the green pixel region is located between two of the transparent pixel regions; in step 3, with the organic transparent photoresist layer as a barrier wall, coating the red and green quantum dot inks corresponding to the red and green pixel regions on the transparent substrate by the way of inkjet printing.

6. The method of fabricating the quantum dot color film substrate according to claim 5, wherein, in step 3, for preventing overflow, coating thicknesses of the red quantum dot layer and the green quantum dot layer are set as 0.01-2 μm less than a thickness of the organic transparent photoresist layer;
   in step 5, the black matrix comprises longitudinal light shading bands and lateral light shading bands; the main spacers are disposed corresponding to the organic transparent photoresist layer above the lateral light shading bands, and the auxiliary spacers are disposed corresponding to the red quantum dot layer and the green quantum dot layer above the lateral light shading bands.

7. The method of fabricating the quantum dot color film substrate according to claim 5, wherein a ratio of an area of the transparent pixel regions (AT) to an area of the red pixel regions (AR) is in a range of $0.05 \leq AT/AR \leq 0.5$, a ratio of the area of the red pixel regions (AR) to an area of the green pixel regions (AG) is in a range of 0.3≤AR/AG≤1.

8. The method of fabricating the quantum dot color film substrate according to claim 1, wherein, in step 2, a material of the organic transparent photoresist layer is a transparent photoresist material having UV curable, thermosetting, or simultaneously photo curable and thermosetting performance; the organic transparent layer is obtained through a yellow light lithography.

9. A method of fabricating a quantum dot color film substrate, comprising following steps:
   step 1, providing a transparent substrate;
   partitioning the transparent substrate into side by side arranged red pixel regions, green pixel regions and transparent pixel regions;
   step 2, forming a patterned organic transparent photoresist layer corresponding to the transparent pixel regions on the transparent substrate;
   step 3, providing a red quantum dot ink and a green quantum dot ink; the red quantum dot ink and the green quantum dot ink at least having an ink of epoxy resin system therein, the ink of epoxy resin system having a prescription as follows:
   an epoxy resin of 40-65 wt %;
   a curing agent of 1-15 wt %;
   an accelerating agent of 0.3-8 wt %;
   a diluting agent of 10-20 wt %;
   pigments of 3-12 wt %;
   quantum dots of 1-10 wt %;
   coating the red quantum dot ink corresponding to the red pixel regions on the transparent substrate by way of inkjet printing, to form a patterned red quantum dot layer, coating the green quantum dot ink corresponding to the green pixel regions on the transparent substrate by way of inkjet printing, to form a patterned green quantum dot layer, so as to obtain a color filter layer comprising the organic transparent photoresist layer, the red quantum dot layer and the green quantum dot layer;
   step 4, forming a graphene conductive layer on the color filter layer when the ink of epoxy resin system is yet cured, to increase adhesion of the graphene conductive layer and the color filter layer; then, completely curing the ink of epoxy resin system on the transparent substrate by one or two ways of UV curing and thermosetting;
   step 5, forming a black photoresist layer on the graphene conductive layer, the black photoresist layer comprising a black matrix, and main spacers and auxiliary spacers located on the black matrix;
   wherein, in step 4, the graphene conductive layer is formed by using transfer, inkjet orienting, spray coating, slit coating, or spin coating;
   wherein, on the transparent substrate, the red pixel regions and the green pixel regions are spaced by the transparent pixel regions, each the red pixel region is located between two of the transparent pixel regions, each the green pixel region is located between two of the transparent pixel regions; in step 3, with the organic transparent photoresist layer as a barrier wall, coating the red and green quantum dot inks corresponding to the red and green pixel regions on the transparent substrate by the way of inkjet printing;
   wherein, in step 3, for preventing overflow, coating thicknesses of the red quantum dot layer and the green quantum dot layer are set as 0.01-2 μm less than a thickness of the organic transparent photoresist layer;
   in step 5, the black matrix comprises longitudinal light shading bands and lateral light shading bands; the main spacers are disposed corresponding to the organic transparent photoresist layer above the lateral light shading bands, and the auxiliary spacers are disposed corresponding to the red quantum dot layer and the green quantum dot layer above the lateral light shading bands;
   wherein, in step 2, a material of the organic transparent photoresist layer is a transparent photoresist material having UV curable, thermosetting, or simultaneously photo curable and thermosetting performance; the organic transparent layer is obtained through a yellow light lithography.

10. The method of fabricating the quantum dot color film substrate according to claim 9, wherein the red quantum dot ink and the green quantum dot ink have viscosities in 1-40 cp, and surface tensions in 30-70 dy/cm.

11. The method of fabricating the quantum dot color film substrate according to claim 9, wherein, in the ink of epoxy resin system, the epoxy resin is a bisphenol A epoxy resin;
   the curing agent is hexahydrophthalic anhydride, tetrahydrophthalic anhydride, butanedihydrazide, adipic dihydrazide, dicyanodiamide or p-phenylenediamine;
   the accelerating agent is 2-ethyl-4-methylimidazole, imidazole, dimethylimidazole or triethylamine;
   the diluting agent is one of isopropyl alcohol, acetone, n-butyl alcohol, glycol ether, ethyl acetate, methyl ethyl ketone, methyl isobutyl ketone, ethylene glycol monomethyl ether, propylene glycol monomethyl ether, propylene glycol methyl ether acetate, propylene glycol monomethyl ether acetate, or a combination thereof;
   the pigments are one of red, green and yellow pigments, or a combination thereof according to display requirement, the red, green and yellow pigments respectively are one of monoazo yellow and orange pigment, disazo pigment, naphthol series pigment, azo lake based pigment, azo condensation pigment, benzimidazolone pigment, phthalocyanine pigment, thioindigo pigment, quinacridone based pigment, quinophthalone based pigment, anthraquinone pigment, dioxazine pigment, triarylmethane based pigment, and diketopyrrolo pyrrole based pigment, or a combination thereof;
   the quantum dots corresponding to red and green quantum dot inks respectively are quantum dots of emitting red light and green light, a material of the quantum dots comprises one or more than one of II-VI groups quantum dot material, and one or more than one of I-III-VI groups quantum dot material; structures of the quantum dots are spherical, core-shell type, spheroidal with convex, or irregular shape.

12. The method of fabricating the quantum dot color film substrate according to claim 9, wherein a ratio of an area of the transparent pixel regions (AT) to an area of the red pixel regions (AR) is in a range of 0.05≤AT/AR≤0.5, a ration of the area of the red pixel regions (AR) to an area of the green pixel regions (AG) is in a range of 0.3≤AR/AG≤1.

* * * * *